(12) United States Patent
Talone et al.

(10) Patent No.: US 10,811,273 B2
(45) Date of Patent: Oct. 20, 2020

(54) METHODS OF SURFACE RESTORATION FOR NITRIDE ETCHING

(71) Applicant: Tokyo Electron Limited, Minato-ku, Tokyo (JP)

(72) Inventors: Christopher Talone, Slingerlands, NY (US); Erdinc Karakas, Portland, OR (US); Andrew Nolan, Kurokawa-gun (JP); Sergey A. Voronin, Glenmont, NY (US); Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/128,001

(22) Filed: Sep. 11, 2018

(65) Prior Publication Data

US 2019/0080926 A1 Mar. 14, 2019

Related U.S. Application Data

(60) Provisional application No. 62/557,375, filed on Sep. 12, 2017.

(51) Int. Cl.
*H01L 21/311* (2006.01)
*H01L 21/3213* (2006.01)
(Continued)

(52) U.S. Cl.
CPC .... *H01L 21/31116* (2013.01); *H01L 21/0206* (2013.01); *H01L 21/30604* (2013.01);
(Continued)

(58) Field of Classification Search
None
See application file for complete search history.

(56) References Cited

U.S. PATENT DOCUMENTS 6,013,582 A * 1/2000 Ionov ............... H01L 21/32139
438/738
9,412,609 B1 8/2016 Nagabhirava et al.
(Continued)

OTHER PUBLICATIONS

PCT Office, Search Report and Written Opinion issued in PCT/US2018/050435 dated Jan. 4, 2019, 10 pages.
(Continued)

*Primary Examiner* — Stephanie P Duclair
(74) *Attorney, Agent, or Firm* — Wood Herron & Evans LLP (57) ABSTRACT

Provided is a method of modifying a surface of a substrate for improved etch selectivity of nitride etching. In an embodiment, the method includes providing a substrate with a nitride-containing structure, the nitride-containing structure having an oxygen-nitrogen layer. The method may also include performing a surface modification process on the nitride-containing structure with the oxygen-nitrogen layer using one or more gases, the surface modification process generating a cleaned nitride-containing structure. Additionally, the method may include performing a nitride etch process using the cleaned nitride-containing structure, wherein the etched nitride-containing structure are included in 5 nm or lower technology nodes, and the nitride etch process meets target etch rate and target etch selectivity, and the cleaned nitride-containing structure meet target residue cleaning objectives.

22 Claims, 8 Drawing Sheets

(51) Int. Cl.
*H01L 21/3105* (2006.01)
*H01L 21/306* (2006.01)
*H01L 21/3065* (2006.01)
*H01L 21/67* (2006.01)
*H01L 21/02* (2006.01)

(52) U.S. Cl.
CPC .. *H01L 21/30608* (2013.01); *H01L 21/30621* (2013.01); *H01L 21/30655* (2013.01); *H01L 21/311* (2013.01); *H01L 21/31055* (2013.01); *H01L 21/31105* (2013.01); *H01L 21/31111* (2013.01); *H01L 21/32137* (2013.01); *H01L 21/67069* (2013.01)

(56) References Cited

U.S. PATENT DOCUMENTS

| | | | |
|---|---|---|---|
| 2003/0207585 A1 | 11/2003 | Choi et al. | |
| 2010/0029073 A1* | 2/2010 | Park | H01L 21/28247 |
| | | | 438/595 |
| 2012/0214298 A1 | 8/2012 | Lim et al. | |
| 2013/0048605 A1* | 2/2013 | Sapre | H01J 37/32357 |
| | | | 216/51 |
| 2013/0316533 A1 | 11/2013 | Zheng et al. | |
| 2015/0249017 A1* | 9/2015 | Raley | H01L 21/0223 |
| | | | 438/696 |
| 2016/0020152 A1 | 1/2016 | Posseme | |

OTHER PUBLICATIONS

PCT Office, International Preliminary Report on Patentability issued in PCT/US2018/050435 dated Mar. 17, 2020, 6 pages.

* cited by examiner

| Step | Press | MW | RF | Mode | Freq | Duty | Gas | | | | | | | | | | | RDC | ESC Temp. | | | E/T | Cycles |
|---|---|---|---|---|---|---|---|---|---|---|---|---|---|---|---|---|---|---|---|---|---|---|---|
| | | | | | | | CF4 | SF6 | Cl2 | N2 | H2 | He | Ar | O2 | C4F6 | CH3F | | C | E | E | | |
| H2 | 200 | 0 | 20 | CW | -- | -- | | | | | 50 | | | | | | | 70 | 70 | 70 | 15 | |
| N2 | 200 | 0 | 20 | CW | -- | -- | | | | 400 | | | 450 | | | | 50 | 70 | 70 | 70 | 15 | |
| SiN | 300 | 750 | 20 | CW | -- | -- | | 22 | | 200 | | | 525 | 420 | | | 50 | 70 | 70 | 70 | XX | XX |

FIG. 8

| Step | Press | MW | RF | Mode | Freq | Duty | Gas | | | | | | | | | | RDC | ESC Temp. | | |
|---|---|---|---|---|---|---|---|---|---|---|---|---|---|---|---|---|---|---|---|---|
| | | | | | | | CF4 | SF6 | Cl2 | N2 | H2 | He | Ar | O2 | C4F6 | CH3F | | C | E | E/T |
| H2 | 200 | 0 | 20 | CW | -- | -- | | | | | 50 | | | | | | 50 | 70 | 70 | 15 |
| N2 | 200 | 0 | 20 | CW | -- | -- | | | | 400 | | | 450 | | | | 50 | 70 | 70 | 15 |

| Step | Press | MW | RF | Mode | Freq | Duty | Gas | | | | | | | | | | RDC | ESC Temp. | | |
|---|---|---|---|---|---|---|---|---|---|---|---|---|---|---|---|---|---|---|---|---|
| | | | | | | | CF4 | SF6 | Cl2 | N2 | H2 | He | Ar | O2 | C4F6 | CH3F | | C | E | E/T |
| H2/N2 | 200 | 0 | 20 | CW | -- | -- | | | | 400 | 50 | | 450 | | | | 50 | 70 | 70 | 15 |

| Step | Press | MW | RF | Mode | Freq | Duty | Gas | | | | | | | | | | RDC | ESC Temp. | | |
|---|---|---|---|---|---|---|---|---|---|---|---|---|---|---|---|---|---|---|---|---|
| | | | | | | | CF4 | SF6 | Cl2 | N2 | H2 | He | Ar | O2 | C4F6 | CH3F | | C | E | E/T |
| Cl2 | 30 | 2000 | 0 | CW | -- | -- | | | 100 | | | | 120 | | | | 50 | 70 | 70 | 10 |

| Step | Press | MW | RF | Mode | Freq | Duty | Gas | | | | | | | | | | RDC | ESC Temp. | | |
|---|---|---|---|---|---|---|---|---|---|---|---|---|---|---|---|---|---|---|---|---|
| | | | | | | | CF4 | SF6 | Cl2 | N2 | H2 | He | Ar | O2 | C4F6 | CH3F | | C | E | E/T |
| CF4/O2 | 20 | 3000 | 0 | CW | -- | -- | 32 | | | | | | 1000 | 26 | | | 50 | 70 | 70 | 10 |

FIG. 10

METHODS OF SURFACE RESTORATION FOR NITRIDE ETCHING

CROSS-REFERENCE TO RELATED APPLICATIONS

This application is related to and claims priority to U.S. Provisional Patent Application Ser. No. 62/557,375 filed on Sep. 12, 2017, the entire contents of which are herein incorporated by reference.

BACKGROUND OF THE INVENTION

Field of Invention

The present invention relates to systems and methods for substrate processing, and more particularly to a method and system for methods for surface restoration for nitride etching.

Description of Related Art

Semiconductor device processing, including micromechanical, microelectrical, and nanoscale device processing often includes multiple processing steps performed in various processing chamber. Processing steps, such as Reactive Ion Etch (RIE), may be performed in RIE etch systems. RIE etch systems may form a plasma fields for bombarding a surface of a workpiece with ions to portions of certain layers formed on the surface of the workpiece.

One such process is a conformal etch of a nitride-containing layer. The nitride etch process should be selective to other materials on the surface, including oxides, silicon, or silicon-germanium (SiGe). The selectivity requirements cause problems with typical etch processes, when any oxidization or other contamination of the nitride layer occurs. The etch processes typically use "recipes" that define the gases to be introduced into the etch chamber, the RF power amplitudes and/or frequencies to be applied in order to form the plasma field, the temperature and pressure within the plasma field, the exposure time, etc. One problem with previous nitride etch processes is that oxide contamination may cause processing anomalies, including tipping or deformation of underlying features, etch stop, etc. Such anomalies cause processing inefficiencies, waste, abnormalities in the finished products, additional costs and time for additional processing steps, and the like.

SUMMARY OF THE INVENTION

Provided is a method of modifying a surface of a substrate for improved etch selectivity of nitride etching. In an embodiment, the method includes providing a substrate with a nitride-containing structure, the nitride-containing structure having an oxygen-nitrogen layer. The method may also include performing a surface modification process on the nitride-containing structure with the oxygen-nitrogen layer using one or more gases, the surface modification process generating a cleaned nitride-containing structure. Additionally, the method may include performing a nitride etch process using the cleaned nitride-containing structure, wherein the etched nitride-containing structure are included in 5 nm or lower technology nodes, and the nitride etch process meets target etch rate and target etch selectivity, and the cleaned nitride-containing structure meet target residue cleaning objectives.

A system for modifying a surface of a substrate for improved etch selectivity of nitride etching is also presented. In an embodiment, the system includes a chamber configured to receive a substrate with a nitride-containing structure, the nitride-containing structure having an oxygen-nitrogen layer. The system may also include a controller coupled to the chamber. The controller may be configured to operate one or more components of the system to perform a surface modification process on the nitride-containing structure with the oxygen-nitrogen layer using one or more gases, the surface modification process generating a cleaned nitride-containing structure, and perform a nitride etch process using the cleaned nitride-containing structure, wherein the etched nitride-containing structure are included in 5 nm or lower technology nodes, and the nitride etch process meets target etch rate and target etch selectivity, and the cleaned nitride-containing structure meet target residue cleaning objectives.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION OF EMBODIMENTS OF THE INVENTION

Methods and systems for patterning sidewall shapes are presented. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Referring now to the drawings, where like reference numerals designate identical or corresponding parts throughout the several views.

Figure 1:
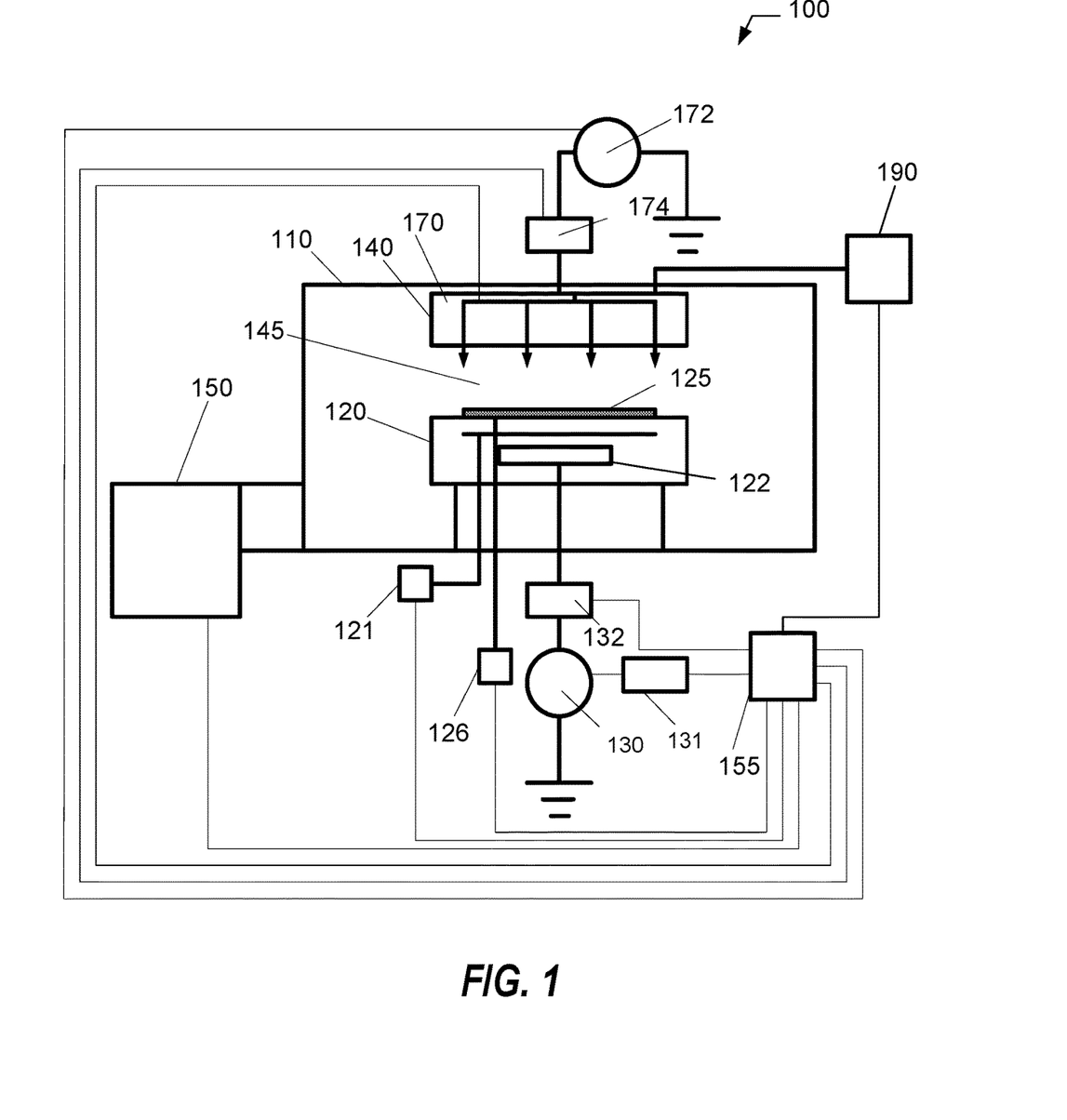
FIG. 1 is a schematic block diagram illustrating one embodiment of a system for surface restoration for nitride etching.

FIG. 1 is an embodiment of a system 100 for surface restoration for nitride etching. In a further embodiment, the system may be configured to perform surface restoration for nitride etching as described with reference to FIGS. 2A-8D. An etch and post heat treatment system 100 configured to perform the above identified process conditions is depicted in FIG. 1 comprising a processing chamber 110, substrate holder 120, upon which a wafer 125 to be processed is affixed, and vacuum pumping system 150. The wafer 125 can be a semiconductor substrate, a wafer, a flat panel display, or a liquid crystal display. Processing chamber 110 can be configured to facilitate etching the processing region 145 in the vicinity of a surface of the wafer 125. An ionizable gas or mixture of process gases is introduced via a gas distribution system 140. For a given flow of process gas, the process pressure is adjusted using the vacuum pumping system 150.

The wafer 125 can be affixed to the substrate holder 120 via a clamping system (not shown), such as a mechanical clamping system or an electrical clamping system (e.g., an electrostatic clamping system). Furthermore, substrate holder 120 can include a heating system (not shown) or a cooling system (not shown) that is configured to adjust and/or control the temperature of substrate holder 120 and the wafer 125. The heating system or cooling system may comprise a re-circulating flow of heat transfer fluid that receives heat from substrate holder 120 and transfers heat to a heat exchanger system (not shown) when cooling, or transfers heat from the heat exchanger system to substrate holder 120 when heating. In other embodiments, heating/cooling elements, such as resistive heating elements, or thermo-electric heaters/coolers can be included in the substrate holder 120, as well as the chamber wall of the processing chamber 110 and any other component within the processing system 100.

Additionally, a heat transfer gas can be delivered to the backside of wafer 125 via a backside gas supply system 126 in order to improve the gas-gap thermal conductance between wafer 125 and substrate holder 120. Such a system can be utilized when temperature control of the wafer 125 is required at elevated or reduced temperatures. For example, the backside gas supply system can comprise a two-zone gas distribution system, wherein the helium gas-gap pressure can be independently varied between the center and the edge of wafer 125.

In the embodiment shown in FIG. 1, substrate holder 120 can comprise an electrode 122 through which RF power is coupled to the processing region 145. For example, substrate holder 120 can be electrically biased at a RF voltage via the transmission of RF power from a RF generator 130 through an optional impedance match network 132 to substrate holder 120. The RF electrical bias can serve to heat electrons to form and maintain plasma. In this configuration, the system 100 can operate as an RIE reactor, wherein the chamber and an upper gas injection electrode serve as ground surfaces.

Furthermore, the electrical bias of electrode 122 at a RF voltage may be pulsed using pulsed bias signal controller 131. The RF power output from the RF generator 130 may be pulsed between an off-state and an on-state, for example. Alternately, RF power is applied to the substrate holder electrode at multiple frequencies. Furthermore, impedance match network 132 can improve the transfer of RF power to plasma in plasma processing chamber 110 by reducing the reflected power. Match network topologies (e.g. L-type, π-type, T-type, etc.) and automatic control methods are well known to those skilled in the art.

Gas distribution system 140 may comprise a showerhead design for introducing a mixture of process gases. Alternatively, gas distribution system 140 may comprise a multi-zone showerhead design for introducing a mixture of process gases, and adjusting the distribution of the mixture of process gases above wafer 125. For example, the multi-zone showerhead design may be configured to adjust the process gas flow or composition to a substantially peripheral region above wafer 125 relative to the amount of process gas flow or composition to a substantially central region above wafer 125. In such an embodiment, gases may be dispensed in a suitable combination to form a highly uniform plasma within the chamber 110.

Vacuum pumping system 150 can include a turbo-molecular vacuum pump (TMP) capable of a pumping speed up to about 8000 liters per second (and greater) and a gate valve for throttling the chamber pressure. In conventional plasma processing devices utilized for dry plasma etching, an 800 to 3000 liter per second TMP can be employed. TMPs are useful for low pressure processing, typically less than about 50 mTorr. For high pressure processing (i.e., greater than about 80 mTorr), a mechanical booster pump and dry roughing pump can be used. Furthermore, a device for monitoring chamber pressure (not shown) can be coupled to the plasma processing chamber 110.

In an embodiment, the source controller 155 can comprise a microprocessor, memory, and a digital I/O port capable of generating control voltages sufficient to communicate and activate inputs to processing system 100 as well as monitor outputs from plasma processing system 100. Moreover, source controller 155 can be coupled to and can exchange information with RF generator 130, pulsed bias signal controller 131, impedance match network 132, the gas distribution system 140, the gas supply 190, vacuum pumping system 150, as well as the substrate heating/cooling system (not shown), the backside gas supply system 126, and/or the electrostatic clamping system 128. For example, a program stored in the memory can be utilized to activate the inputs to the aforementioned components of processing system 100 according to a process recipe in order to perform a plasma assisted process, such as a plasma etch process or a post heating treatment process, on wafer 125.

In addition, the processing system 100 can further comprise an upper electrode 170 to which RF power can be coupled from RF generator 172 through optional impedance match network 174. A frequency for the application of RF power to the upper electrode can range from about 0.1 MHz to about 200 MHz, in one embodiment. Alternatively, the present embodiments may be used in connection with Inductively Coupled Plasma (ICP) sources, Capacitive Coupled Plasma (CCP) sources, Radial Line Slot Antenna (RLSA) sources configured to operate in GHz frequency ranges, Electron Cyclotron Resonance (ECR) sources configured to operate in sub-GHz to GHz ranges, and others. Additionally, a frequency for the application of power to the lower electrode can range from about 0.1 MHz to about 80 MHz. Moreover, source controller 155 is coupled to RF generator 172 and impedance match network 174 in order to control the application of RF power to upper electrode 170. The design and implementation of an upper electrode is well known to those skilled in the art. The upper electrode 170 and the gas distribution system 140 can be designed within the same chamber assembly, as shown. Alternatively, upper electrode 170 may comprise a multi-zone electrode design for adjusting the RF power distribution coupled to plasma above wafer 125. For example, the upper electrode 170 may be segmented into a center electrode and an edge electrode.

Depending on the applications, additional devices such as sensors or metrology devices can be coupled to the processing chamber 110 and to the source controller 155 to collect real time data and use such real time data to concurrently control two or more selected integration operating variables in two or more steps involving deposition processes, RIE processes, pull processes, profile reformation processes, heating treatment processes and/or pattern transfer processes of the integration scheme. Furthermore, the same data can be used to ensure integration targets including completion of post heat treatment, patterning uniformity (uniformity), pulldown of structures (pulldown), slimming of structures (slimming), aspect ratio of structures (aspect ratio), line width roughness, substrate throughput, cost of ownership, and the like are achieved.

By modulating the applied power, typically through variation of the pulse frequency and duty ratio, it is possible to obtain markedly different plasma properties from those produced in continuous wave (CW). Consequently, RF power modulation of the electrodes can provide control over time-averaged ion flux and the ion energy.

Figure 2A:
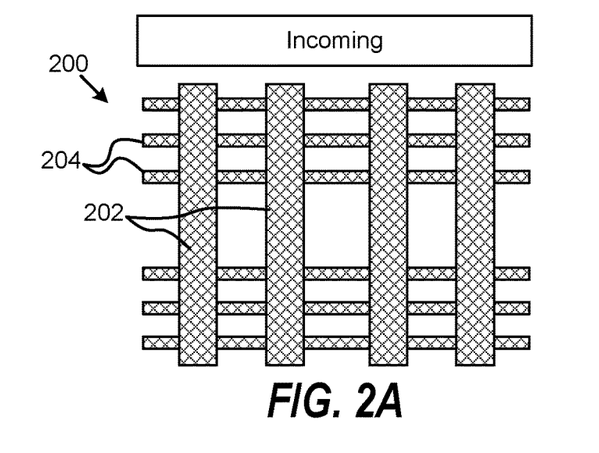
FIG. 2A is a top view diagram illustrating one embodiment of a semiconductor device workpiece.

FIG. 2A is a top view diagram illustrating one embodiment of a semiconductor device workpiece. As illustrated in FIG. 2A, the incoming workpiece 200 may include one or more gate structures 202 and one or more underlying structures 204. The one or more gate structures 202 may be formed by a Directed Self Assembly (DSA) process, in one embodiment. One of ordinary skill will recognize that the present embodiments may be applied to alternative device structures. Indeed, the present embodiments may be applied to any nitride-containing layer.

Figure 2B:
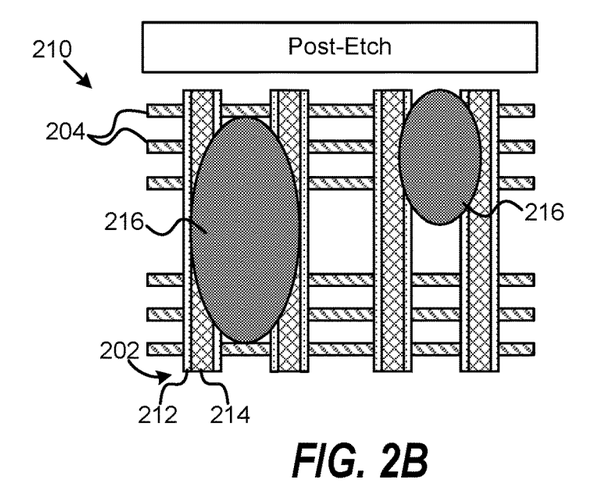
FIG. 2B is a top view diagram illustrating one embodiment of a semiconductor device workpiece.

As shown in FIG. 2B, the device structure may be contaminated during a nitride etch process. For example, a nitride etch may be performed using an O2 etch chemistry, which may form contaminants 216, such as oxides or salt deposits on the opened semiconductor device workpiece 210. The opened semiconductor device workpiece 210 may include the nitride layer 212 and exposed silicon layer 214.

Figure 2C:
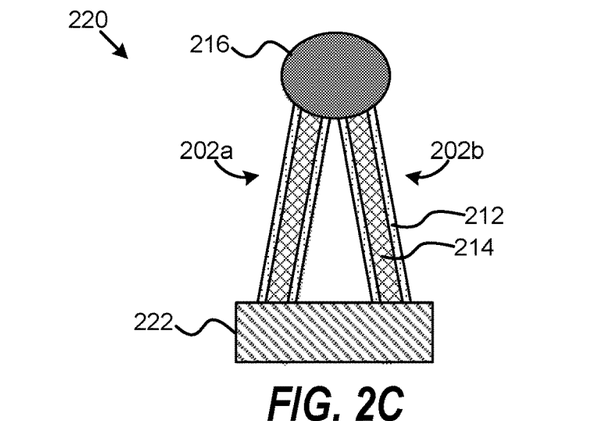
FIG. 2C is a cross-section view diagram illustrating one embodiment of a semiconductor device workpiece.

As shown in FIG. 2C, the contaminant 216 may inhibit the etch or cause other deformations in the process such as tipped gates. In such an embodiment, the weight of the contaminant 216 may cause a first gate 202a to tip against a second gate 202b. The gates 202a-b may be formed on a substrate 222.

For example, a conformal nitride etch process that is highly selective to Si or SiGe may require a high $O_2$ flow rate. Because of the high $O_2$ flow, the nitride may be modified during the process to contain more oxygen or be oxidized. After oxidization of the nitride, if the workpiece is exposed to fluorine, a salt may form, thereby creating the contaminants 216. One embodiment of a nitride etch process may use SF6 as an etch gas, thereby forming $(NR_4)_2SF6$ salt.

An example of processing conditions that may cause contamination as shown in FIGS. 2B-2C is shown in Table 1.

TABLE 1

| | | | Processing Conditions | | | | | |
|---|---|---|---|---|---|---|---|---|
| | | | | | Gas | | | ESC Temp. |
| Step | Press | MW | RF | SF$_6$ | N$_2$ | AR | O$_2$ | ° C. |
| SiN | 300 | 750 | 0 | 22 | 200 | 525 | 420 | 70 |

In Table 1, the pressure is measured in pascals, the microwave and RF power is measured in Watts, the gas flow rates are measured in sccm, and the temperature is measured in Celsius. One of ordinary skill will recognize that the parameters in Table 1 are only representative of examples of processing parameters, and that each of the parameters may be varied depending upon target processing objectives. For example, the pressure may be in a range of 20-300 pascals. The RF power may be in a range of 10-30 W or in a range of 0-100 W in other embodiments. The MW power may be in a range of 1 kW-4 kW, or in a range of 0-10 kW. Similarly, the temperature may be in a range of 50-100° C.

Figure 3A:
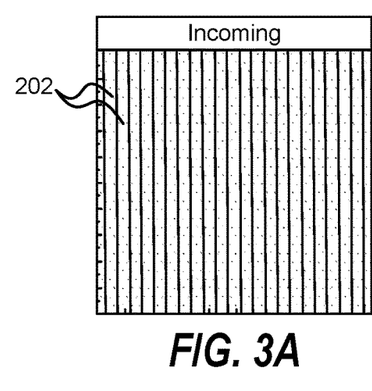
FIG. 3A is a top view diagram illustrating one embodiment of a semiconductor device workpiece.
Figure 3B:
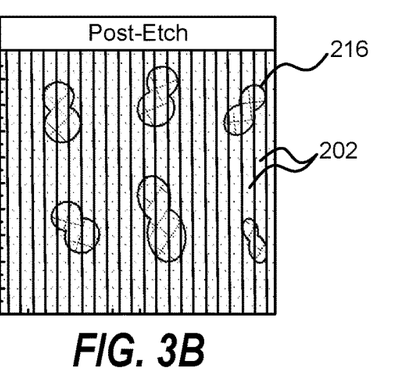
FIG. 3B is a top view diagram illustrating one embodiment of a semiconductor device workpiece.

FIG. 3A illustrates a top view diagram of on incoming workpiece, having one or more features formed on a surface thereof. In one embodiment, the features may be gate structures 202 formed, for example, according to a Directed Self-Assembly (DSA) process. FIG. 3B shows the results of a nitride etch process. As illustrated, the etch process does not completely remove the nitride and contaminants 216 are formed on the surface of the workpiece. The contaminants may be, for example, salts as described above.

Figure 4:
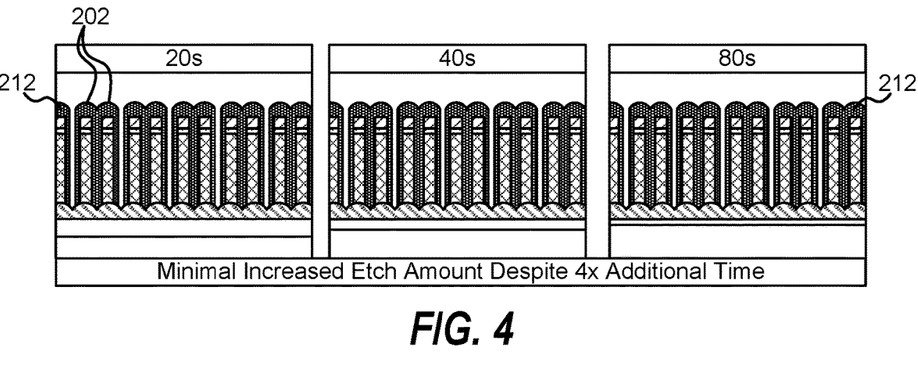
FIG. 4 is cross-section diagram illustrating time-spaced processing of a semiconductor device workpiece.

FIG. 4 illustrates that the etch stop induced by oxidization of the nitride during etch may cause etch stop. As shown, there is very little reduction in the overall nitride 212, despite continuous etching for extended periods. In the embodiment of FIG. 4, the workpiece was etched for 20 seconds, 40 seconds and 80 seconds without any appreciable change in the nitride 212 because of the etch stop.

Figure 5:
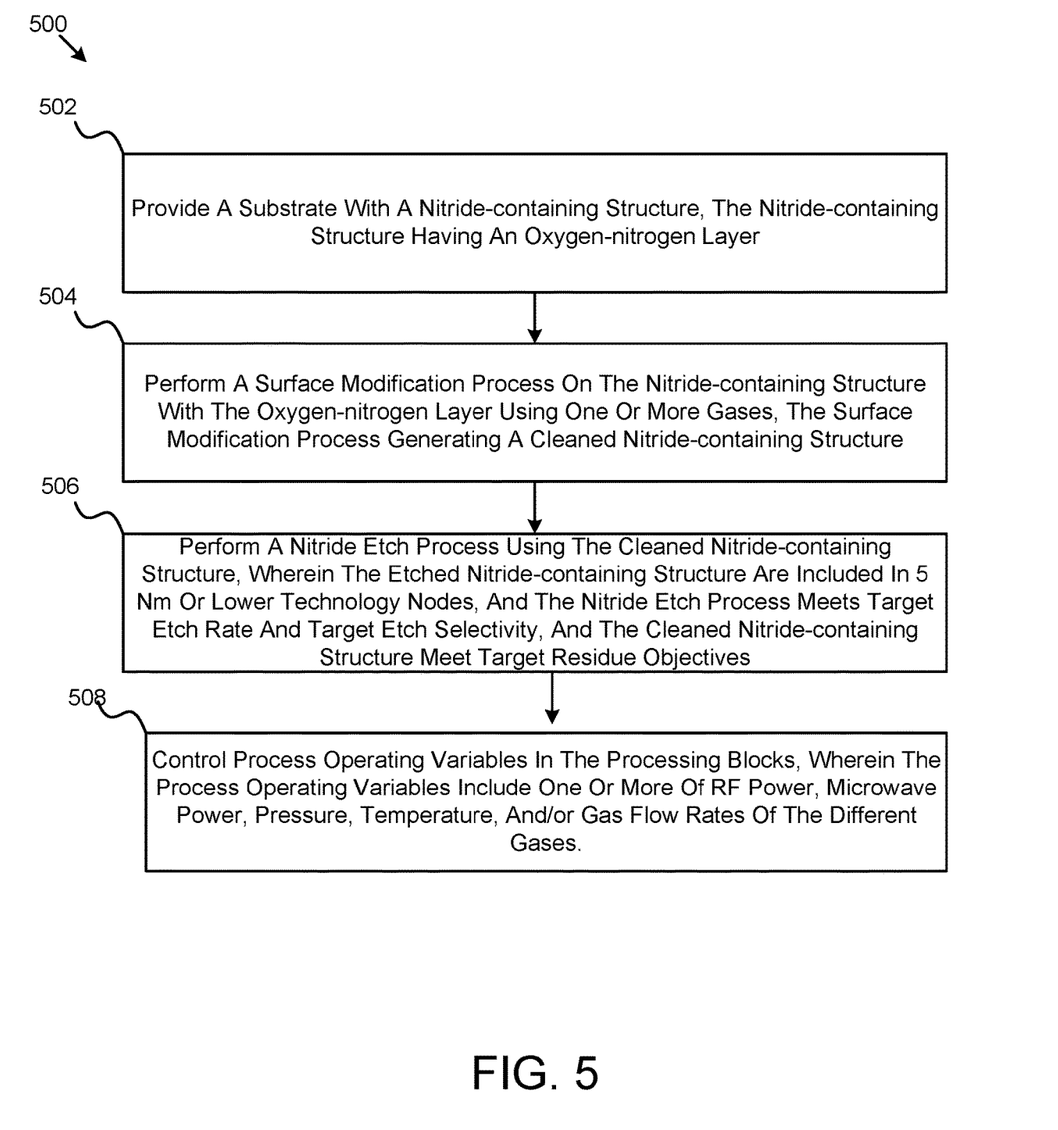
FIG. 5 is a flowchart diagram illustrating one embodiment of a method for surface restoration for nitride etching.

FIG. 5 illustrates one embodiment of a method 500 of modifying a surface of a substrate for improved etch selectivity of nitride etching. The method 500 may include providing a substrate with a nitride-containing structure, the nitride-containing structure having an oxygen-nitrogen layer as shown at block 502. In an embodiment, the method 500 includes performing a surface modification process on the nitride-containing structure with the oxygen-nitrogen layer using one or more gases, the surface modification process generating a cleaned nitride-containing structure, as shown at block 504. At block 506, the method includes performing a nitride etch process using the cleaned nitride-containing structure, wherein the etched nitride-containing structure are included in 5 nm or lower technology nodes, and the nitride etch process meets target etch rate and target etch selectivity, and the cleaned nitride-containing structure meet target residue removal objectives. At block 508, the method includes controlling process operating variables in the processing blocks, wherein the process operating variables include one or more of RF power, microwave power, pressure, temperature, gas flow rates of the different gases, and the like. Residue removal objectives may include removal of salt contaminants 216, removal of the oxy-nitride layer 306 etc. Further processing objectives may be etching of the nitride layer 306 to a predetermined degree, critical dimensions (CD) of an inner spacer formed according to the described processes, etc.

Figure 6A:
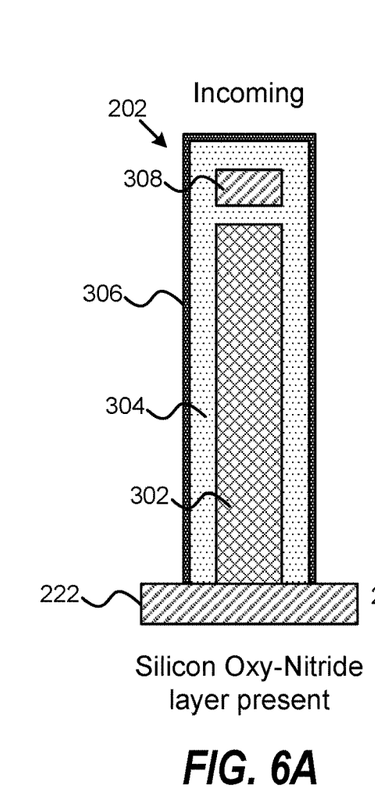
FIG. 6A is a cross-section view diagram illustrating one embodiment of a semiconductor device in a processing workflow.
Figure 6B:
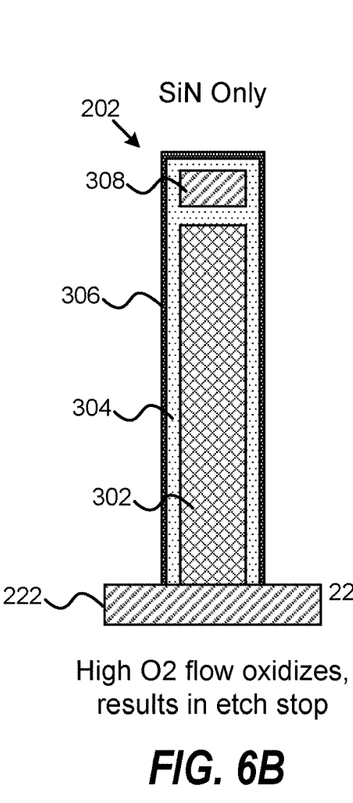
FIG. 6B is a cross-section view diagram illustrating one embodiment of a semiconductor device in a processing workflow.

The embodiment of FIGS. 6A-6D illustrate various embodiments of etch processes for formation of a semiconductor device structure 202, such as a transistor gate stack. In an embodiment, the structure 202 may be formed on an oxide layer 222 and have a Si or poly-Si core 302. The core 302 may be coated in a conformal layer of nitride 304. Additionally, a Si or poly-Si cap 308 may be formed. The exterior surface of the structure 202 may comprise oxidized nitride forming an oxy-nitride layer 306. When exposed to the SF6 etch gas, the contaminant 216 may be formed by combination of the oxy-nitride layer 306 and the fluorine in the etch gas. Moreover, the high O$_2$ content of the etch gas may cause the oxy-nitride layer to grow sufficiently to cause etch stop as shown in FIG. 6B.

Figure 6C:
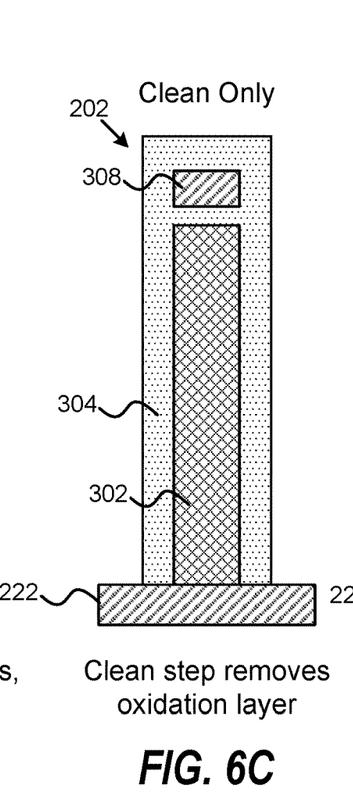
FIG. 6C is a cross-section view diagram illustrating one embodiment of a semiconductor device in a processing workflow.
Figure 6D:
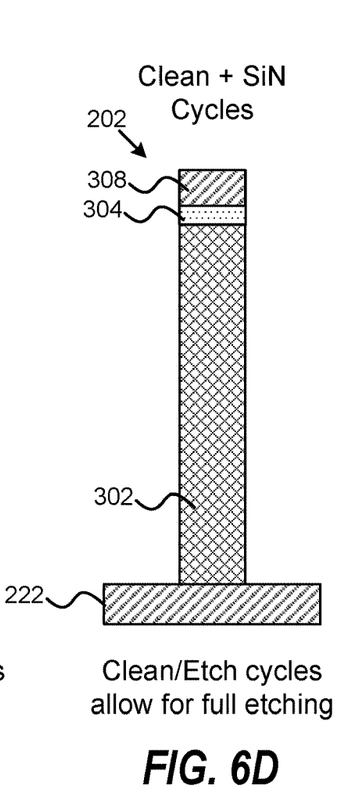
FIG. 6D is a cross-section view diagram illustrating one embodiment of a semiconductor device in a processing workflow.

In an embodiment, the oxy-nitride layer 306 may be cleaned from the surface of the nitride layer 304 using a cleaning etch process. In such an embodiment, a short surface modification or cleaning process may be performed using, for example H$_2$, N$_2$, C$_{12}$ or CF$_4$ plasmas to remove the oxy-nitride layer 306 as shown in FIG. 6C. After the cleaning step of FIG. 6C, the remaining nitride layer 304 may be etched away using a nitride etch plasma as in the first step, as shown in FIG. 6D. On of ordinary skill will recognize that the etch process of FIGS. 6B and 6D alternating with the surface modification step of FIG. 6C may be repeated iteratively for a plurality of cycles, depending upon the target processing objectives. The duty cycle of the iterations may be sufficient to achieve target residue cleaning objectives. For example, in one embodiment, the surface modification may be performed for a duration of 5-90 seconds and repeated for a range of 1-10 cycles, depending upon the etch performance. The surface modification step of FIG. 6C may prevent etch stop due to oxidization, and may also reduce the formation of salt contaminants 216 during the nitride etch processes.

In an embodiment, the oxy-nitride layer 606 may be cleaned from the surface of the nitride layer 604 using a cleaning etch process. In such an embodiment, a short surface modification or cleaning process may be performed using, for example H$_2$, N$_2$, Cl$_2$ or CF$_4$ plasmas to remove the oxy-nitride layer 606 as shown in FIG. 6C. After the cleaning step of FIG. 6C, the remaining nitride layer 604 may be etched away using a nitride etch plasma as in the first step, as shown in FIG. 6D. On of ordinary skill will recognize that the etch process of FIGS. 6B and 6D alternating with the surface modification step of FIG. 6C may be repeated iteratively for a plurality of cycles, depending upon the target processing objectives. The duty cycle of the iterations may be sufficient to achieve target residue cleaning objectives. For example, in one embodiment, the surface modification may be performed for a duration of 5-90 seconds and repeated for a range of 1-10 cycles, depending upon the etch performance. The surface modification step of FIG. 6C may prevent etch stop due to oxidization, and may also reduce the formation of salt contaminants 216 during the nitride etch processes.

Figure 7A:
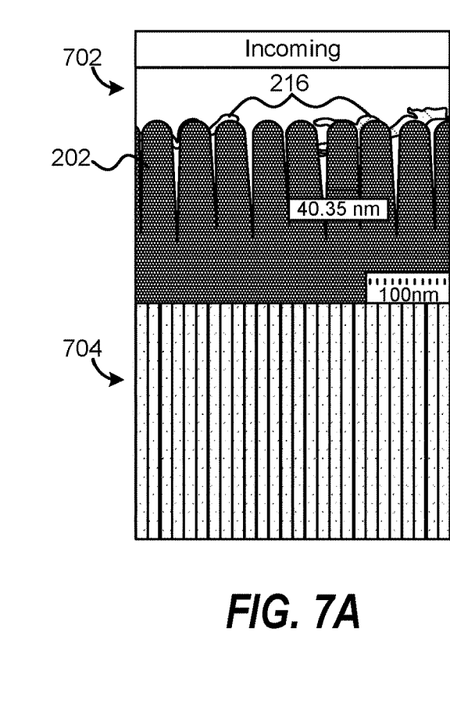
FIG. 7A illustrates one embodiment of a of a semiconductor device in a processing workflow.
Figure 7B:
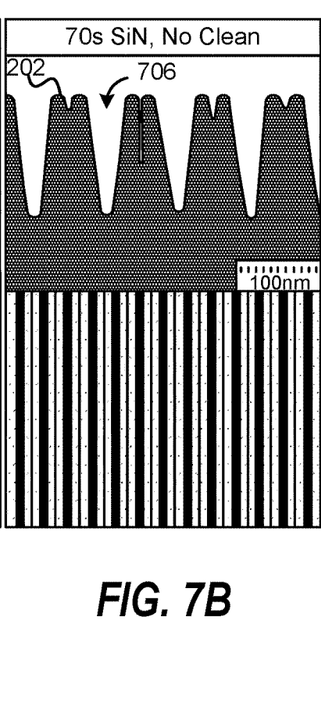
FIG. 7B illustrates one embodiment of a of a semiconductor device in a processing workflow.

FIGS. 7A-7D illustrate results of various processing procedures. In each of FIGS. 7A-7D, the top panel 702 illustrates a cross-section and the bottom panel 704 illustrates a top view of the structures 202. FIG. 7A illustrates the incoming workpiece, which has one or more structures 202 with contaminants 216 thereon. In FIG. 7B, it can be seen that 70 seconds of SiN etch without a cleaning process may cause tilted structures with gaps 706 left between pairs of tilted structures 202. Such results may not meet target processing objectives.

Figure 7C:
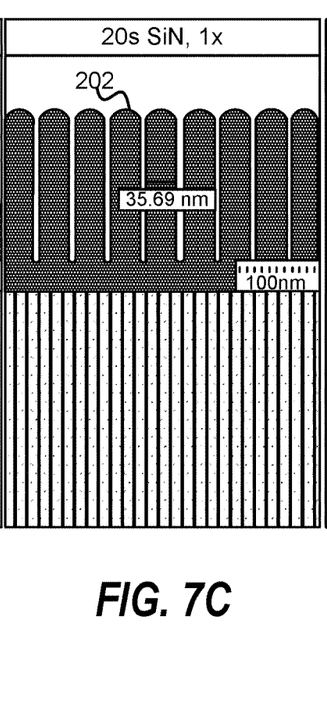
FIG. 7C illustrates one embodiment of a of a semiconductor device in a processing workflow.

In order to avoid the tilted structures 202 and gaps 706 of FIG. 7B, a surface modification or cleaning step may be performed. In such an embodiment, the surface modification may yield more uniformly spaced structures 202, however the structures may not be sufficiently etched due to etch stop from buildup of oxides during the nitride etch portion of the process. For example, in one result, the structures may be 35.69 nm after 20 seconds of processing and a single clean step as shown in FIG. 7C.

Enhanced results may be obtained by cycling multiple surface modification steps. For example, in the results of FIG. 7D, two cycles of surface modification alternating with nitride etch may be performed over a 20 second period. In such an embodiment, the etch stop of FIG. 7C is avoided, and the structures are further etched to a width of 31.71 nm.

Figure 7D:
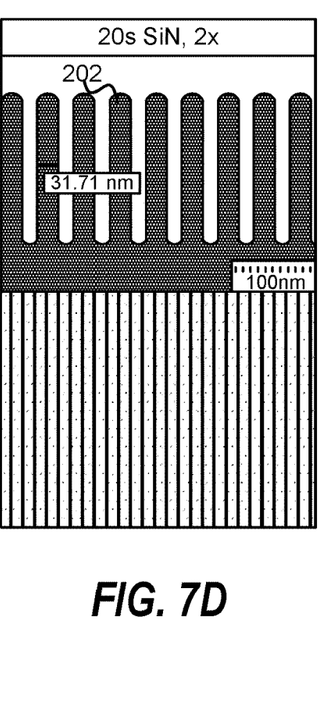
FIG. 7D illustrates one embodiment of a of a semiconductor device in a processing workflow.
Figure 8:
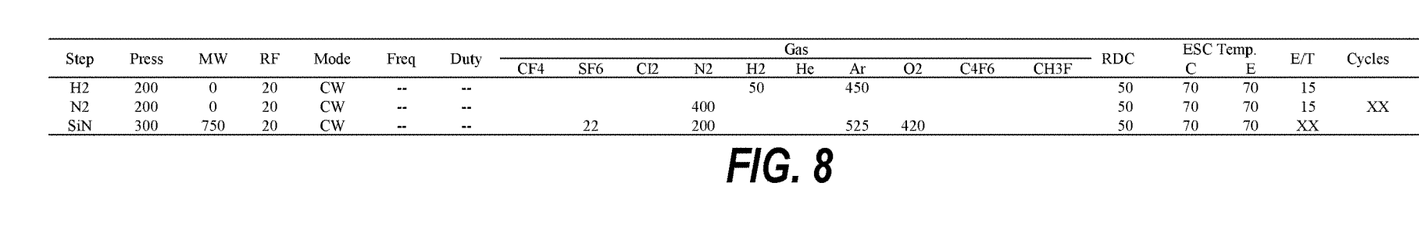
FIG. 8 illustrates a table of processing parameters.

FIG. 8 illustrates a table of sample processing parameters used in obtaining the results of FIGS. 7A-7D. Although the figures in FIG. 8 represent parameters that are suitable according to the present embodiments, one of ordinary skill will recognize that a range of parameter values may be employed. For example, flow rates of H2 may be in a range of 10-100 sccm, and flow rates of N2 may be in a range of 200-600 sccm.

Figure 9A:
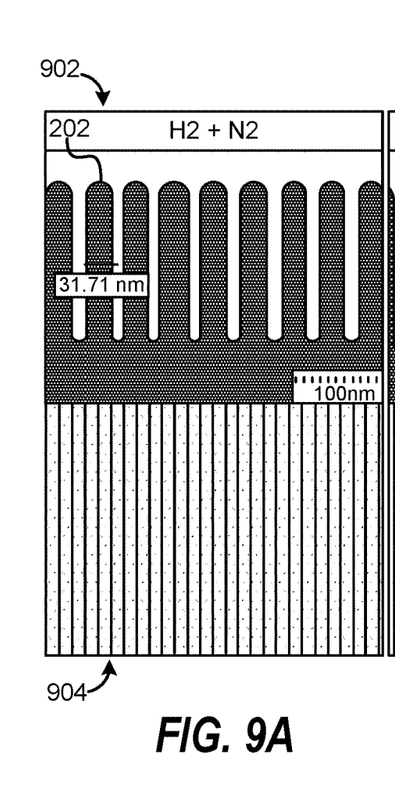
FIG. 9A illustrates one embodiment of a of a semiconductor device in a processing workflow.
Figure 9B:
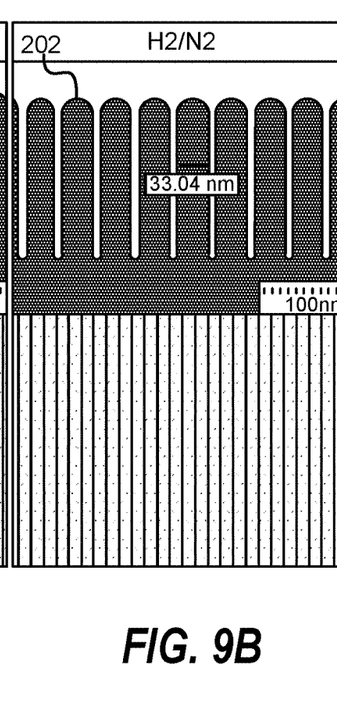
FIG. 9B illustrates one embodiment of a of a semiconductor device in a processing workflow.
Figure 9C:
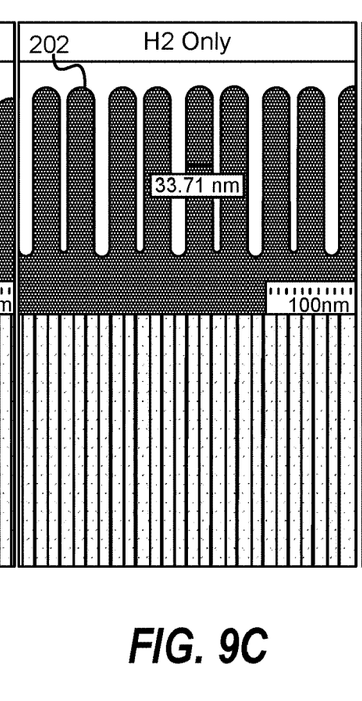
FIG. 9C illustrates one embodiment of a of a semiconductor device in a processing workflow.
Figure 9D:
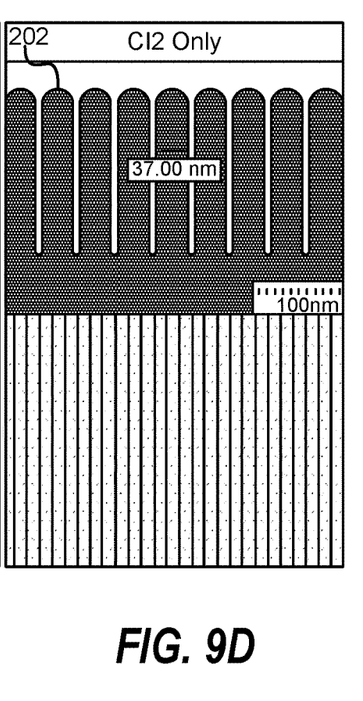
FIG. 9D illustrates one embodiment of a of a semiconductor device in a processing workflow.

FIGS. 9A-9D illustrate the effects of using various etch chemistries for the surface modification process. The top panels 902 illustrate a cross-section view of each result and the bottom panels 904 illustrate a top view of each result in FIGS. 9A-9D respectively. FIG. 9A illustrates the results of a combined H2 and N2 etch process. As illustrated, the H2+N2 surface modification substantially limits etch stop and provides structures 202 that are relatively evenly spaced. The alternating H2/N2 surface modification of FIG. 9B yields good uniformity of spacing of the structures 202, avoids tipping, but does not provide as high a degree of etch as the process used to obtain the results of FIG. 9A. FIG. 9C illustrates the results of an H2 surface modification process without N2. Such a process may be beneficial in certain processes where it is required to limit the use of N2 in surface processing, but the H2-only process does not yield the high degree of uniformity of the structures 202, although tipping is avoided. As illustrated in FIG. 9D, Cl2 may be used for the surface modification process. While Cl2 does prevent tipping of the structures 202, it does not prevent etch stop to the same degree as the processes of FIGS. 9A-9C. For example, in the results of FIG. 9D, the width of the structures is 37.00 nm, as compared to 31.71 nm for the process of FIG. 9A. In one embodiment, a higher number of surface modification cycles may be used with certain processes, such as the Cl2 process of FIG. 9D to achieve a more complete etch of the structure 202.

The time period of the surface modification step and the time between surface modification steps may be determined in response to the etch chemistry used for the process and the resultant etch characteristics. Thus, the period and duration of the surface modification process may be controlled to meet target manufacturing objectives.

Figure 10:
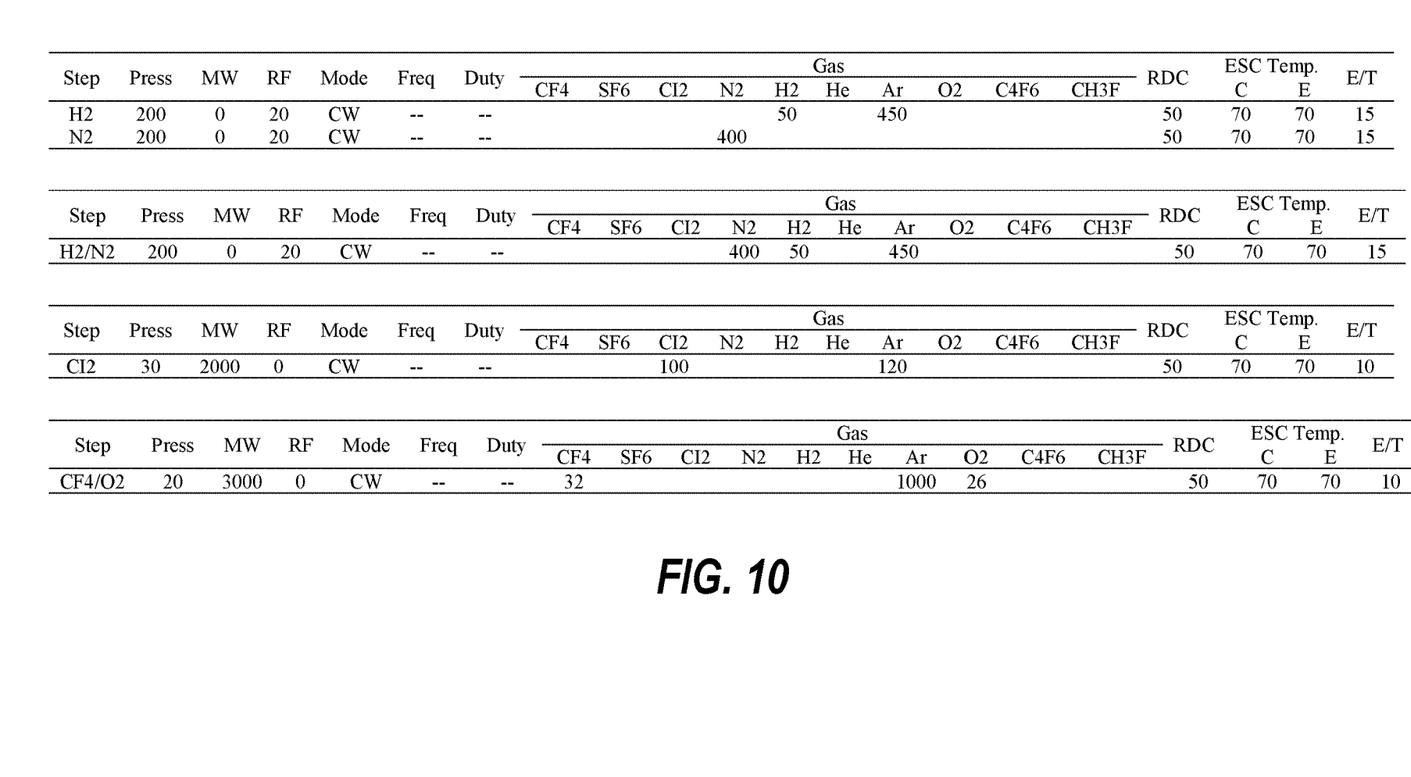
FIG. 10 illustrates a table of processing parameters.

FIG. 10 illustrates a table of processing parameters used to obtain the results of FIGS. 9A-9D. Although the figures in FIG. 10 represent parameters that are suitable according to the present embodiments, one of ordinary skill will recognize that a range of parameter values may be employed. For example, flow rates of Cl2 may be in a range of 50-200 sccm, and flow rates of CF4 may be in a range of 10-50 sccm. All other values referenced in FIGS. 8 and 10 may be varied by various ranges. For example, in one embodiment, the parameters may be varied by a range of +/−10%. In other embodiments, the parameters may be varied by a range of +/−20%, +/−50%, +/−100%, etc.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What we claim:

1. A method of modifying a surface of a substrate for improved etch selectivity of nitride etching, the method comprising:
    providing a substrate with a nitride-containing structure, the nitride-containing structure having an oxygen-nitrogen layer;
    performing a surface modification process on the nitride-containing structure with the oxygen-nitrogen layer using one or more gases, the surface modification process generating a cleaned nitride-containing structure, wherein the surface modification process includes conformally removing the oxygen-nitrogen layer from the nitride-containing structure; and
    performing a nitride etch process using the cleaned nitride-containing structure;
    wherein the etched nitride-containing structure are included in 5 nm or lower technology nodes, and the nitride etch process meets target etch rate and target etch selectivity, and the cleaned nitride-containing structure meet target residue cleaning objectives.

2. The method of claim 1, further comprising iteratively repeating the sequence of the surface modification process and the nitride etch process.

3. The method of claim 2, wherein the surface modification process is repeated at a duty cycle sufficient to achieve target residue cleaning objectives.

4. The method of claim 2, wherein the surface modification process is repeated for a range of 1-10 cycles.

5. The method of claim 4, wherein the surface modification process comprises a dry etch process.

6. The method of claim 1, wherein the surface modification process is performed for a duration in a range of 5 seconds to 90 seconds.

7. The method of claim 6, wherein an etch gas used in the surface modification process comprises hydrogen.

8. The method of claim 6, wherein an etch gas used in the surface modification process comprises nitrogen.

9. The method of claim 8, wherein the nitrogen is introduced into an etch chamber at a flow rate in a range of 200-600 sccm.

10. The method of claim 6, wherein an etch gas used in the surface modification process comprises chlorine.

11. The method of claim 10, wherein the chlorine is introduced into an etch chamber at a flow rate in a range of 50-200 sccm.

12. The method of claim 6, wherein an etch gas used in the surface modification process comprises a combination of hydrogen and nitrogen containing gasses.

13. The method of claim 12, wherein the $CF_4$ is introduced into an etch chamber at a flow rate in a range of 10-50 sccm.

14. The method of claim 6, wherein the surface modification process comprises a first etch step and a second etch step, wherein one of the first etch step and the second etch step uses an etch gas comprising hydrogen, and the other of the first etch step and the second etch step uses an etch gas comprising nitrogen.

15. The method of claim 6, wherein an etch gas used in the surface modification process comprises a combination of $CF_4$ and $O_2$.

16. The method of claim 1, wherein the surface modification process comprises an etch process suitable for removing the oxygen-nitrogen layer.

17. The method of claim 16, wherein the hydrogen is introduced into an etch chamber at a flow rate in a range of 10-100 sccm.

18. The method of claim 1, wherein the surface modification step occurs at a pressure in a range of 20-300 pascals.

19. The method of claim 1, wherein the surface modification process further comprising energizing the etch gas with Radio Frequency (RF) power in a power range of 10-30 W.

20. The method of claim 1, wherein the surface modification process further comprising energizing the etch gas with microwave (MW) power in a power range of 1 kW-4 kW.

21. The method of claim 1, wherein an etch gas used in the nitride etch process comprises a SF6.

22. The method of claim 1 wherein a controller controls one or more process operating variables in order to meet the target etch rate, target etch selectivity, critical dimensions of cleaned nitride-containing structure; and target residue objectives.

* * * * *

UNITED STATES PATENT AND TRADEMARK OFFICE
CERTIFICATE OF CORRECTION

PATENT NO. : 10,811,273 B2
APPLICATION NO. : 16/128001
DATED : October 20, 2020
INVENTOR(S) : Christopher Talone et al.

It is certified that error appears in the above-identified patent and that said Letters Patent is hereby corrected as shown below:

On the Title Page

Column 2, "Abstract" last 5 lines, "wherein the etched nitride-containing structure are included in 5 nm or lower technology nodes, and the nitride etch process meets target etch rate and target etch selectivity, and the cleaned nitride-containing structure meet target residue cleaning objectives." should be -- wherein the etched nitride-containing structure is included in 5 nm or lower technology nodes, and the nitride etch process meets target etch rate and target etch selectivity, and the cleaned nitride-containing structure meets target residue cleaning objectives. --

In the Drawings

FIG. 5, #506 "Structure Are Included in 5 Nm or Lower Technology Nodes, And The Nitride Etch Process Meets Target Etch Rate And Target Etch Selectivity, And The Cleaned Nitride-containing Structure Meet" should be -- Structure Is Included in 5 Nm or Lower Technology Nodes, And The Nitride Etch Process Meets Target Etch Rate And Target Etch Selectivity, And The Cleaned Nitride-containing Structure Meets --

In the Specification

Column 1, Line approx. 16-20, "Semiconductor device processing, including micromechanical, microelectrical, and nanoscale device processing often includes multiple processing steps performed in various processing chamber." should be -- Semiconductor device processing, including micromechanical, microelectrical, and nanoscale device processing often includes multiple processing steps performed in various processing chambers. --

Column 1, Line approx. 29, "etch systems may form a plasma fields" should be -- etch systems may form plasma fields --

Column 1, approx. last 5 lines, "wherein the etched nitride-containing structure are included in 5 nm or lower technology nodes, and the nitride etch process meets target etch rate and target etch Signed and Sealed this
Thirteenth Day of July, 2021

Drew Hirshfeld
*Performing the Functions and Duties of the
Under Secretary of Commerce for Intellectual Property and
Director of the United States Patent and Trademark Office*

CERTIFICATE OF CORRECTION (continued)
U.S. Pat. No. 10,811,273 B2 selectivity, and the cleaned nitride-containing structure meet target residue cleaning objectives." should be -- wherein the etched nitride-containing structure is included in 5 nm or lower technology nodes, and the nitride etch process meets target etch rate and target etch selectivity, and the cleaned nitride-containing structure meets target residue cleaning objectives. --

Column 2, Line approx. 13-17, "the etched nitride-containing structure are included in 5 nm or lower technology nodes, and the nitride etch process meets target etch rate and target etch selectivity, and the cleaned nitride-containing structure meet target residue cleaning objectives." should be -- the etched nitride-containing structure is included in 5 nm or lower technology nodes, and the nitride etch process meets target etch rate and target etch selectivity, and the cleaned nitride-containing structure meets target residue cleaning objectives. --

Column 2, Line approx. 41, "FIG. 4 is cross-section diagram" should be -- FIG. 4 is a cross-section diagram --

Column 2, Line approx. 57-58, "FIG. 7A illustrates one embodiment of a of a semiconductor device in a" should be -- FIG. 7A illustrates one embodiment of a semiconductor device in a --

Column 2, Line approx. 59-60, "FIG. 7B illustrates one embodiment of a of a semiconductor device in a" should be -- FIG. 7B illustrates one embodiment of a semiconductor device in a --

Column 2, Line approx. 61-62, "FIG. 7C illustrates one embodiment of a of a semiconductor device in a" should be -- FIG. 7C illustrates one embodiment of a semiconductor device in a --

Column 2, Line approx. 63-64, "FIG. 7D illustrates one embodiment of a of a semiconductor device in a" should be -- FIG. 7D illustrates one embodiment of a semiconductor device in a --

Column 2, Line approx. 66-67, "FIG. 9A illustrates one embodiment of a of a semiconductor device in a" should be -- FIG. 9A illustrates one embodiment of a semiconductor device in a --

Column 3, Line 1-2, "FIG. 9B illustrates one embodiment of a of a semiconductor device in a" should be -- FIG. 9B illustrates one embodiment of a semiconductor device in a --

Column 3, Line 3-4, "FIG. 9C illustrates one embodiment of a of a semiconductor device in a" should be -- FIG. 9C illustrates one embodiment of a semiconductor device in a --

Column 3, Line 5-6, "FIG. 9D illustrates one embodiment of a of a semiconductor device in a" should be -- FIG. 9D illustrates one embodiment of a semiconductor device in a --

Column 6, Line approx. 7-8, "design and implementation of an upper electrode is well known to those skilled" should be -- design and implementation of an upper electrode are well known to those skilled --

Column 7, Line approx. 55-60, "structure, wherein the etched nitride-containing structure are included in 5 nm or lower technology nodes, and the nitride etch process meets target etch rate and target etch selectivity, and the cleaned nitride-containing structure meet target residue removal objectives."

CERTIFICATE OF CORRECTION (continued)
U.S. Pat. No. 10,811,273 B2 should be -- structure, wherein the etched nitride-containing structure is included in 5 nm or lower technology nodes, and the nitride etch process meets target etch rate and target etch selectivity, and the cleaned nitride-containing structure meets target residue removal objectives. --

Column 8, Line 4-5, "The embodiment of FIGS. 6A-6D illustrate various embodiments of etch processes for" should be -- FIGS. 6A-6D illustrate various embodiments of etch processes for --

Column 8, Line approx. 27, "On of ordinary skill will" should be -- One of ordinary skill will --

Column 8, Lines 40-60, should be deleted

In the Claims

Column 10, Line 28-32, Claim 1, "wherein the etched nitride-containing structure are included in 5 nm or lower technology nodes, and the nitride etch process meets target etch rate and target etch selectivity, and the cleaned nitride-containing structure meet target residue cleaning objectives." should be -- wherein the etched nitride-containing structure is included in 5 nm or lower technology nodes, and the nitride etch process meets target etch rate and target etch selectivity, and the cleaned nitride-containing structure meets target residue cleaning objectives. --

Column 10, Line 60, Claim 14, "hydrogen and nitrogen containing gasses." should be -- hydrogen and nitrogen containing gases. --

Column 11, Line 15-16, Claim 19, "The method of claim 1, wherein the surface modification process further comprising energizing the etch gas" should be -- The method of claim 1, wherein the surface modification process further comprises energizing the etch gas --

Column 11, Line 19-20, Claim 20, "The method of claim 1, wherein the surface modification process further comprising energizing the etch gas" should be -- The method of claim 1, wherein the surface modification process further comprises energizing the etch gas --

Column 11, Line 23-24, Claim 21, "The method of claim 1, wherein an etch gas used in the nitride etch process comprises a SF6." should be -- The method of claim 1, wherein an etch gas used in the nitride etch process comprises SF6. --